(12) United States Patent
Kawai et al.

(10) Patent No.: US 7,691,724 B2
(45) Date of Patent: Apr. 6, 2010

(54) METHOD FOR MANUFACTURING SOI SUBSTRATE

(75) Inventors: Makoto Kawai, Gunma (JP); Yoshihiro Kubota, Gunma (JP); Atsuo Ito, Gunma (JP); Koichi Tanaka, Gunma (JP); Yuuji Tobisaka, Gunma (JP); Shoji Akiyama, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 37 days.

(21) Appl. No.: 12/076,422

(22) Filed: Mar. 18, 2008

(65) Prior Publication Data

US 2008/0254595 A1 Oct. 16, 2008

(30) Foreign Application Priority Data

Apr. 12, 2007 (JP) ............................. 2007-105176

(51) Int. Cl.
*H01L 21/30* (2006.01)
(52) U.S. Cl. ...................... 438/458; 438/143; 438/149; 438/464; 257/347; 257/E27.112; 257/E21.32; 257/E21.112; 257/E21.561; 257/E21.569
(58) Field of Classification Search ................ 438/143, 438/149, 458, 464, 528, 795, 799, 974; 257/347, 257/E27.112, E21.32, 561, 569
See application file for complete search history.

(56) References Cited

U.S. PATENT DOCUMENTS

| 5,843,832 | A |   | 12/1998 | Farmer et al. |
| 5,891,265 | A | * | 4/1999 | Nakai et al. ............... 148/33.3 |
| 6,468,923 | B1 | * | 10/2002 | Yonehara et al. ........... 438/761 |
| 6,489,654 | B2 | * | 12/2002 | Ogura ....................... 257/347 |
| 2002/0153563 | A1 |   | 10/2002 | Ogura |
| 2005/0245048 | A1 |   | 11/2005 | Graf et al. |

FOREIGN PATENT DOCUMENTS

EP    0 697 713 A1    2/1996

(Continued)

OTHER PUBLICATIONS

Auberton-Herve et al., "Smart Cut Technology: Industrial Status of SOI Wafer Production and New Material Developments", *Electrochemical Society Proceedings*, vol. 99, No. 3, pp. 93-106 (1999).

*Primary Examiner*—Charles D Garber
*Assistant Examiner*—Yasser A Abdelaziez
(74) *Attorney, Agent, or Firm*—Oliff & Berridge, PLC

(57) ABSTRACT

A method for manufacturing an SOI substrate, including the steps of implanting hydrogen ions from a main surface of a single-crystal silicon substrate having an interstitial oxygen concentration which is equal to or below $1 \times 10^{18}$ cm$^{-3}$; performing an activation treatment with respect to the main surface of at least one of a transparent insulative substrate and the silicon substrate; bonding the main surface of the transparent insulative substrate to the main surface of the silicon substrate at a room temperature; performing a heat treatment with respect to the bonded substrate at a temperature falling within the range of 350° C. to 550° C. and having a cooling rate after the heat treatment that is equal to or below 5° C./minute; and mechanically delaminating a silicon thin film from the silicon substrate to form a silicon film on the main surface of the transparent insulative substrate.

12 Claims, 1 Drawing Sheet

FOREIGN PATENT DOCUMENTS

| | | |
|---|---|---|
| EP | 0 961 312 A2 | 12/1999 |
| EP | 1 513 193 A1 | 3/2005 |
| JP | A 6-18926 | 1/1994 |
| JP | A 11-145438 | 5/1999 |
| JP | A 11-163363 | 6/1999 |
| JP | B2 3048201 | 3/2000 |
| JP | A 2002-110998 | 4/2002 |
| JP | A 2003-282885 | 10/2003 |

* cited by examiner

METHOD FOR MANUFACTURING SOI SUBSTRATE

BACKGROUND OF THE INVENTION

1. Field of the Invention

The present invention relates to a method for manufacturing an SOI substrate having a silicon thin film on a transparent insulative substrate.

2. Description of the Related Art

An SOI (Silicon on Insulator) wafer having a single-crystal silicon (Si) layer on an insulator film such as an oxide film is used as a device forming substrate for the purpose of forming an MOS transistor which is superior in radiation-proof characteristics or latch-up characteristics and also superior in suppression of a short-channel effect. Among others, a low-defect SOI substrate obtained by applying a bonding technology attracts attention. Further, in recent years, using such an SOI substrate as an optical device manufacturing substrate has been examined (e.g., Japanese Patent Application Laid-open No. 145438-1999, Japanese Patent Application Laid-open No. 18926-1994, Japanese Patent Application Laid-open No. 163363-1999, Japanese Patent Application Laid-open No. 2003-282885 and Japanese Patent Application Laid-open No. 2002-110998).

In regard to an SOI substrate having a silicon thin film on an insulator substrate, an SOITEC method (a SmartCut method) of bonding a silicon substrate having hydrogen ions implanted on a bonding surface side to a handling substrate (a support substrate) and performing a heat treatment at approximately 500° C. or above to thermally delaminate the silicon thin film from a region having the highest concentration of the implanted hydrogen ions is known. This method is based on a mechanism of adopting heating to "grow" high-density "air bubbles" called "hydrogen blisters" formed by implantation of the hydrogen ions and utilizing this "air bubble growth" to delaminate the silicon thin film (e.g., Japanese Patent No. 3048201 or A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) p. 93-106)).

Meanwhile, a single-crystal silicon substrate is roughly classified into an FZ silicon substrate grown by a floating zone (FZ) method and a CZ silicon substrate grown by a Czochralski (CZ) method, and the CZ silicon substrate occupies 80% or more of a total amount used. This CZ silicon substrate is manufactured by heating polysilicon put in a crucible formed of high-purity quartz by a graphite heater to be dissolved, growing an ingot having a large diameter by a technique of gradually increasing a crystal diameter of a narrow seed crystal, and slicing and polishing this grown ingot. However, when the dissolved silicon reacts with the quartz crucible at a high temperature during ingot growth, an oxygen impurity, which has eluted in a silicon solution, is introduced into the crystal at a concentration of approximately 20 to 30 ppma. The thus introduced oxygen impurity is called "interstitial oxygen" since it is placed between lattices of a silicon crystal. This interstitial oxygen is precipitated in the crystal since it enters a supersaturation state during an ingot cooling process or a device manufacturing process, and it becomes an electrically active "defect" depending on its precipitation conformation.

For example, in a case where a heat treatment at approximately 500° C. or above is required in a process for manufacturing an SOI substrate like the above-explained SOITEC method (the SmartCut method), a so-called "new donor" is produced when this heat treatment is carried out in a temperature range of 600 to 700° C., and a so-called "thermal donor" is produced when this heat treatment is performed in a temperature range of 400 to 500° C. These defects (oxygen donors) results in a problem that electrical characteristics (a resistivity) of a silicon layer of an obtained SOI substrate become different from those at the initial stage.

In view of the above-explained problem, it is an object of the present invention to provide an SOI substrate having no worry about a fluctuation in electrical characteristics due to generation of oxygen donors.

SUMMARY OF THE INVENTION

To achieve this object, a method for manufacturing an SOI substrate according to the present invention comprises: a step A of implanting hydrogen ions from a main surface of a single-crystal silicon substrate having an interstitial oxygen concentration which is equal to or below $1\times10^{18}$ $cm^{-3}$; a step B of performing an activation treatment with respect to the main surface of at least one of a transparent insulative substrate and the silicon substrate; a step C of bonding the main surface of the transparent insulative substrate to the main surface of the silicon substrate at a room temperature; a step D of performing a heat treatment with respect to the bonded substrate at a temperature falling within the range of 350° C. to 550° C.; and a step E of mechanically delaminating a silicon thin film from the silicon substrate to form a silicon film on the main surface of the transparent insulative substrate.

Preferably, the interstitial oxygen concentration of the single-crystal silicon substrate is equal to or below $5\times10^{17}$ $cm^{-3}$, and a heat treatment temperature at the step D falls within the range of 400° C. to 500° C. Further, preferably, a cooling rate after the heat treatment at the step D is equal to or below 5° C./minute.

In the present invention, the activation treatment at the step B is performed based on at least one of, e.g., a plasma treatment and an ozone treatment, and, e.g., quartz, sapphire, borosilicate glass, or crystallized glass is used for the transparent insulative substrate.

In the present invention, since the single-crystal silicon substrate having the interstitial oxygen concentration which is equal to or below a predetermined concentration is used when manufacturing the SOI substrate by a bonding method, generation of defects (oxygen donors) due to electrically active interstitial oxygen can be considerably suppressed in a process for manufacturing the SOI substrate as well as a process for manufacturing a device.

Furthermore, since such a substrate is used, a cooling rate of a heat treatment performed in the process for manufacturing the SOI substrate can be sufficiently slowed, and there is no worry about a breakage failure, e.g., a crack or a chip of the substrate due to a thermal strain.

DETAILED DESCRIPTION OF THE PREFERRED EMBODIMENTS

Figure 1:
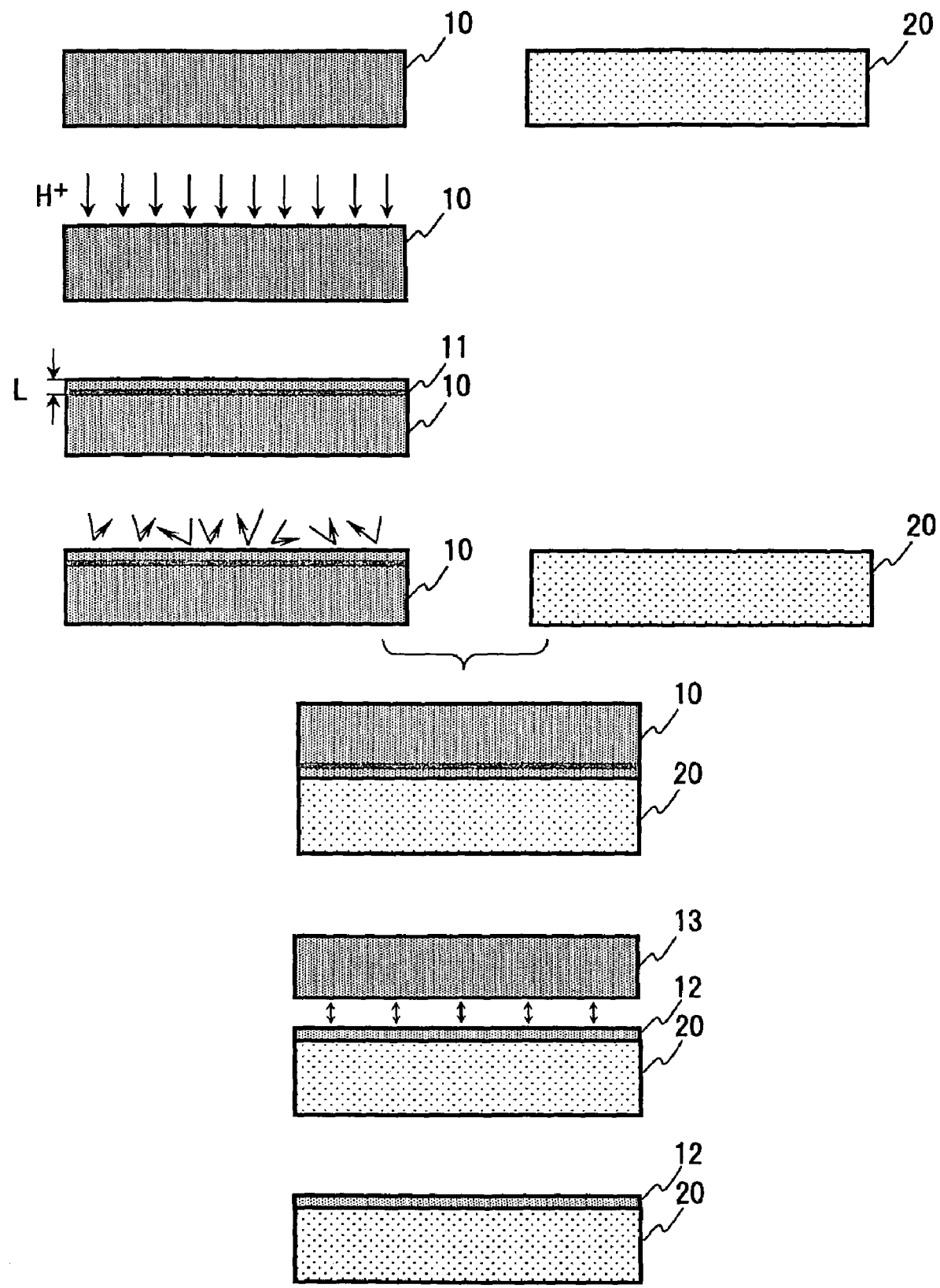
FIG. 1 are views for explaining a process example of a method for manufacturing an SOI substrate according to the present invention.

A method for manufacturing an SOI substrate according to the present invention will now be explained based on an embodiment. It is to be noted that a transparent insulative substrate will be explained as a quartz substrate, this substrate may be a sapphire substrate, a borosilicate glass substrate, or a crystallized glass substrate.

Embodiment

FIG. 1 are views for explaining a process example of a method for manufacturing an SOI substrate according to the present invention. It is to be noted that an oxide film is not provided on a surface of a silicon substrate in this embodiment, a silicon substrate having an oxide film formed on a surface thereof in advance may be used.

A silicon substrate 10 depicted in FIG. 1(A) is a p-type (a specific resistance is approximately 10 Ωcm) substrate having a plane orientation (100) and boron (B) doped therein, and it is a single-crystal Si substrate in which an interstitial oxygen concentration measured by infrared absorption spectrophotometry is $1 \times 10^{18}$ $cm^{-3}$ or below. Specifically, the silicon substrate 10 is a substrate with a diameter of 8 inches which has an interstitial oxygen concentration of approximately $5 \times 10^{17}$ $cm^{-3}$ and is grown by an MCZ (magnetic field applied CZ) method. In the present invention, the interstitial oxygen concentration of the single-crystal silicon substrate to be used is set to $1 \times 10^{18}$ $cm^{-3}$ or below because a degree of formation of oxygen donors is strongly dependent on the interstitial oxygen concentration. When the CZ single-crystal silicon substrate is subjected to a heat treatment at a temperature near, e.g., 450° C., a thermal donor as a lattice defect having a very low energy level is produced. However, it has been reported that its generation ratio on an initial generation stage is in proportion to an initial interstitial oxygen concentration raised to the fourth power.

The present inventors have examined heat treatment conditions in a process for manufacturing an SOI substrate and a process for manufacturing a general device. As a result, they have reached a conclusion that setting the interstitial oxygen concentration of the single-crystal silicon substrate used for bonding to $1 \times 10^8$ $cm^{-3}$ or below enables suppressing a fluctuation in electrical characteristics (a resistivity) of a silicon layer (an SOI layer) of the SOI substrate to a practically problem-free level. Although such a single-crystal silicon substrate can be obtained by a regular CZ method, it can be readily acquired by an MCZ method that can control a convection of a silicon melt by applying a magnetic field or an FZ method that uses no quartz crucible. It is to be noted that, when the interstitial oxygen concentration is set to $5 \times 10^{17}$ $cm^{-3}$ or below, the above-explained fluctuation in electrical characteristics (a resistivity) in the heat treatment process can be practically ignored.

It is to be noted that a conductivity type, an electrical characteristic value such as a specific resistivity, a crystal orientation, or a crystal diameter of the single-crystal Si substrate 10 is appropriately selected in dependence on a design value or a process of a device adopting an SOI substrate manufactured by the method according to the present invention or a display area of a device to be manufactured.

The single-crystal Si substrate 10 and a quartz substrate 20 to be bonded have the same diameter. The same orientation flat (OF) as an OF provided on the single-crystal Si substrate 10 is likewise provided on the quartz substrate 20 and these substrates are bonded while matching these OFs with each other.

First, hydrogen ions are implanted into a surface of the single-crystal Si substrate 10 (FIG. 1(B)). This ion implanted surface serves as a bonding surface (a joint surface) at a later step. Based on this hydrogen ion implantation, an ion implanted region 11 is formed at a predetermined depth (an average ion implantation depth L) near the surface of the single-crystal Si substrate 10 (FIG. 1(C)). This ion implanted region 11 serves as a delamination region at a later step.

AS a dose amount at the time of hydrogen ion implantation, an appropriate value is selected from the range of, e.g., $1 \times 10^{16}$ to $4 \times 10^{17}$ $atoms/cm^2$ in accordance with a specification and others of an SOI substrate. Further, the depth of the ion implanted region 11 from the surface of the single-crystal Si substrate 10 (the average ion implantation depth L) is controlled by an acceleration voltage at the time of ion implantation and determined in dependence on a thickness of the SOI layer to be delaminated. For example, the average ion implantation depth L is set to 0.5 μm or below, and the acceleration voltage is set to, e.g., 50 to 100 KeV. It is to be noted that an insulator film such as an oxide film may be formed on the ion implanted surface of the single-crystal Si substrate 10 in advance and ion implantation may be carried out through this insulator film, which is usually performed to suppress channeling of implanted ions in a process of implanting the ions into an Si crystal.

A plasma treatment or an ozone treatment is performed with respect to a main surface of the single-crystal Si substrate 10 having the ion implanted region 11 formed thereon in this manner for the purpose of surface cleaning or surface activation (FIG. 1(D)). Such a surface treatment is carried out to remove an organic material on the surface serving as the bonding surface or increase an OH group on the surface, thereby achieving surface activation. It is to be noted that such a surface treatment may be performed with respect to the main surface of at least one of the silicon substrate and the transparent insulative substrate.

When performing this surface treatment based on the plasma treatment, the single-crystal Si substrate and/or the quartz substrate having the surface cleaned by, e.g., RCA cleaning in advance is mounted on a sample stage in a vacuum chamber, and a plasma gas is introduced into the vacuum chamber to provide a predetermined degree of vacuum. It is to be noted that, as the plasma gas type used in this process, there is an oxygen gas, a hydrogen gas, an argon gas, a mixed gas of these gases, or a mixed gas of the hydrogen gas and a helium gas. After introducing the plasma gas, a high-frequency plasma having a power of approximately 100 W is generated, the treatment is performed with respect to the surface of the single-crystal Si substrate and/or the quartz substrate as a plasma treatment target for approximately 5 to 10 seconds, and then the treatment is terminated.

When performing the surface treatment based on the ozone treatment, the single-crystal Si substrate and/or the quartz substrate having the cleaned surface is mounted on a sample stage in a chamber having an oxygen containing atmosphere, and a plasma gas such as a nitrogen gas or an argon gas is introduced into this chamber. Then, a high-frequency plasma having a predetermined power is generated, oxygen in the atmosphere is converted into ozone by using this plasma, and the treatment is carried out with respect to the surface of the single-crystal Si substrate and/or the quartz substrate as a treatment target for a predetermined time.

The main surfaces of the single-crystal Si substrate 10 and the quartz substrate 20 subjected to the surface treatment are pressed against each other to be bonded at a room temperature (FIG. 1(E)). As explained above, since the surface (the bonding surface) of at least one of the single-crystal Si substrate 10 and the quartz substrate 20 is activated because of the surface treatment, e.g., the plasma treatment or the ozone treatment, bonding strength that can sufficiently resist mechanical delamination or mechanical polishing at a later step can be obtained even in an appressed (bonded) state at a room temperature.

Subsequently, a step of performing a heat treatment at a relatively low temperature (the range of 350° C. to 550° C.) in a state where the single-crystal Si substrate 10 is bonded to the quartz substrate 20 is provided. A main purpose of this heat treatment step is increasing the bonding strength of the single-crystal silicon substrate 10 and the quartz substrate 20. However, in this heat treatment, a secondary effect that a thermal stress due to a thermal expansion coefficient difference between the single-crystal Si substrate 10 and the quartz substrate 20 is produced to weaken chemical bonding of silicon atoms in the ion implanted region 11 can be expected depending on an amount of the implanted hydrogen ions.

It is to be noted that a lower upper limit temperature is preferable to reduce a thermal strain produced between the single-crystal Si substrate 10 and the quartz substrate 20 during the heat treatment and, on the other hand, a higher lower limit temperature is preferable to increase the bonding strength of the single-crystal silicon substrate 10 and the quartz substrate 20. Therefore, setting the heat treatment temperature to fall within the range of 400° C. to 500° C. is preferable.

Although the heat treatment is performed in such a temperature range and then the bonded substrate is cooled, a cooling rate after the heat treatment is set to 5° C./minute or below to very slowly cool the substrate in the present invention. Such a cooling condition is adopted in order to avoid a breakage failure (e.g., a crack or a chip) of the substrate due to the thermal expansion coefficient difference (a thermal strain) between the single-crystal Si substrate 10 and the quartz substrate 20.

After such a treatment, an external impact shock is given to the bonded substrate to mechanically delaminate a silicon thin film 12 from a bulk 13 of the single-crystal Si substrate to be transferred (FIG. 1(F)). This transference enables obtaining an SOI substrate in which an SOI film 12 is formed on the main surface of the quartz substrate 20 (FIG. 1(G)). It is to be noted that various kinds of techniques for giving an impact shock from the outside to delaminate the silicon thin film are present. In this embodiment, however, the impact shock is given by belching out a water jet near the ion implanted region 11 without heating the bonded substrate.

The thus obtained SOI film is excellently transferred onto the entire surface of the quartz substrate, the conductivity type (the p type) and the resistance value (the specific resistance value: 10 Ωcm) on the initial stage are maintained, and formation of oxygen donors is not recognized after the heat treatment was carried out at 450° C. for 50 hours.

As explained above, in the present invention, when manufacturing the SOI substrate by the bonding method, the single-crystal silicon substrate having the interstitial oxygen concentration which is equal to or below a predetermined concentration is used, and hence generation of defects (oxygen donors) due to the electrically active interstitial oxygen can be considerably suppressed in the process for manufacturing the SOI substrate as well as the process for manufacturing a device.

Moreover, since such a substrate is used, the cooling rate of the heat treatment carried out in the process for manufacturing the SOI substrate can be sufficiently slowed, and there is no worry about a breakage failure such as a crack or a chip of the substrate due to a thermal strain.

The present invention provides the SOI substrate whose electrical characteristics do not fluctuate due to generation of oxygen donors.

What is claimed is:

1. A method for manufacturing an SOI substrate comprising:
    a step A of implanting hydrogen ions from a main surface of a single-crystal silicon substrate having an interstitial oxygen concentration which is equal to or below $1 \times 10^{18}$ cm$^{-3}$;
    a step B of performing an activation treatment with respect to the main surface of at least one of a transparent insulative substrate and the silicon substrate;
    a step C of bonding the main surface of the transparent insulative substrate to the main surface of the silicon substrate at a room temperature;
    a step D of performing a heat treatment with respect to the bonded substrate at a temperature falling within the range of 350° C. to 550° C. wherein a cooling rate after the heat treatment of the step D is equal to or below 5° C./minute; and
    a step E of mechanically delaminating a silicon thin film from the silicon substrate to form a silicon film on the main surface of the transparent insulative substrate.

2. The method for manufacturing an SOI substrate according to claim 1, wherein the interstitial oxygen concentration of the single-crystal silicon substrate is equal to or below $5 \times 10^{17}$ cm$^{-3}$.

3. The method for manufacturing an SOI substrate according to claim 1, wherein the heat treatment temperature at the step D falls within the range of 400° C. to 500° C.

4. The method for manufacturing an SOI substrate according to claim 2, wherein the heat treatment temperature at the step D falls within the range of 400° C. to 500° C.

5. The method for manufacturing an SOI substrate according to claim 1, wherein the activation treatment at the step B is at least one of a plasma treatment and an ozone treatment.

6. The method for manufacturing an SOI substrate according to claim 2, wherein the activation treatment at the step B is at least one of a plasma treatment and an ozone treatment.

7. The method for manufacturing an SOI substrate according to claim 3, wherein the activation treatment at the step B is at least one of a plasma treatment and an ozone treatment.

8. The method for manufacturing an SOI substrate according to claim 4, wherein the activation treatment at the step B is at least one of a plasma treatment and an ozone treatment.

9. The method for manufacturing an SOI substrate according to claim 1, wherein the transparent insulative substrate is formed of any one of quartz, sapphire, borosilicate glass, and crystallized glass.

10. The method for manufacturing an SOI substrate according to claim 2, wherein the transparent insulative substrate is formed of any one of quartz, sapphire, borosilicate glass, and crystallized glass.

11. The method for manufacturing an SOI substrate according to claim 3, wherein the transparent insulative substrate is formed of any one of quartz, sapphire, borosilicate glass, and crystallized glass.

12. The method for manufacturing an SOI substrate according to claim 4, wherein the transparent insulative substrate is formed of any one of quartz, sapphire, borosilicate glass, and crystallized glass.

* * * * *